(12) United States Patent
Ding et al.

(10) Patent No.: US 11,799,440 B2
(45) Date of Patent: Oct. 24, 2023

(54) PACKAGING STRUCTURE AND METHOD OF ACOUSTIC DEVICE

(71) Applicant: Wuhan MEMSonics Technologies Co., Ltd., Wuhan (CN)

(72) Inventors: Zhipeng Ding, Singapore (SG); Qin Ren, Singapore (SG); Bowoon Soon, Singapore (SG); Bangtao Chen, Singapore (SG); Liyan Siow, Singapore (SG); Weiliang Teo, Singapore (SG); Chao Gu, Wuhan (CN); Yan Liu, Wuhan (CN); Binghui Lin, Wuhan (CN)

(73) Assignee: Wuhan MEMSonics Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/949,251

(22) Filed: Sep. 21, 2022

(65) Prior Publication Data
US 2023/0308073 A1      Sep. 28, 2023

(30) Foreign Application Priority Data

Mar. 22, 2022   (CN) .......................... 202210286564.0

(51) Int. Cl.
*H03H 9/02*     (2006.01)
*H03H 3/02*     (2006.01)
(Continued)

(52) U.S. Cl.
CPC ............ *H03H 9/0211* (2013.01); *H03H 3/02* (2013.01); *H03H 9/0523* (2013.01); *H03H 9/105* (2013.01); *H03H 9/173* (2013.01)

(58) Field of Classification Search
CPC .... H03H 9/0211; H03H 9/0523; H03H 9/105; H03H 9/173; H03H 3/02
See application file for complete search history.

(56) References Cited

U.S. PATENT DOCUMENTS 8,698,376 B2 *   4/2014   Chen .................. H03H 9/02244
                                                                310/309
2018/0183406 A1   6/2018   Patil et al.
(Continued)

FOREIGN PATENT DOCUMENTS

CN         1722939 A    1/2006
CN       104821798 A    8/2015
(Continued)

*Primary Examiner* — Emily P Pham
(74) *Attorney, Agent, or Firm* — Gang Yu

(57) ABSTRACT

The disclosure provides a packaging structure and method of an acoustic device, relating the technical field of semiconductors, including: a substrate and a piezoelectric stack structure located on the substrate, a first organic material layer is disposed on the piezoelectric stack structure, a second organic material layer is disposed on the first organic material layer, the first organic material layer includes a first supporting part and a second supporting part, the second supporting part forms a first acoustic reflection structure, when being transmitted to the first acoustic reflection structure, acoustic waves can be reflected back to the effective area, so that the loss of the acoustic waves is reduced, and the performance of the acoustic device is improved. The first supporting part is matched with the second organic material layer to form a second acoustic reflection structure, so that when part of acoustic waves are not reflected back by the first acoustic reflection structure and are transmitted to the second acoustic reflection structure, the acoustic waves can be reflected back to the effective area, so that the loss of the acoustic waves is further reduced, and the performance of the acoustic device is improved.

20 Claims, 4 Drawing Sheets

(51) Int. Cl.
*H03H 9/17* (2006.01)
*H03H 9/10* (2006.01)
*H03H 9/05* (2006.01)

(56) References Cited

U.S. PATENT DOCUMENTS

| | | | |
|---|---|---|---|
| 2019/0190488 A1* | 6/2019 | Dasgupta | ............... H03H 9/205 |
| 2019/0245509 A1 | 8/2019 | Hurwitz | |
| 2020/0144986 A1 | 5/2020 | Park et al. | |
| 2020/0365996 A1 | 11/2020 | Roth et al. | |
| 2021/0028751 A1 | 1/2021 | Hurwitz et al. | |
| 2021/0226605 A1 | 7/2021 | Schieber | |
| 2021/0234525 A1* | 7/2021 | Kim | ....................... H03H 9/105 |
| 2021/0242855 A1 | 8/2021 | Luo | |

FOREIGN PATENT DOCUMENTS

| | | |
|---|---|---|
| CN | 112039481 A | 12/2020 |
| CN | 112886939 A | 6/2021 |
| CN | 113193847 A | 7/2021 |
| CN | 113659954 A | 11/2021 |
| CN | 215268210 U | 12/2021 |
| CN | 114121828 A | 3/2022 |
| CN | 114142822 A | 3/2022 |

\* cited by examiner

A-A'

PACKAGING STRUCTURE AND METHOD OF ACOUSTIC DEVICE

CROSS-REFERENCE TO RELATED APPLICATION

The present disclosure claims priority to Chinese Patent Application No. CN202210286564.0, filed on Mar. 22, 2022 and entitled "Packaging Structure and Method of Acoustic Device", the entire contents of which is hereby incorporated by reference.

TECHNICAL FIELD

The disclosure relates to the technical field of semiconductors, in particular to a packaging structure and method of an acoustic device.

BACKGROUND

A film bulk acoustic resonator needs to be prevented from being subjected to mechanical impact, humidity influence, gas erosion and the like of an external environment when being applied in the environment. In order to ensure that a high-performance resonator can be used for a long time, the resonator needs to be packaged. Packaging refers to a process of assembling a device matching integrated circuit into a final chip product, which plays roles in mounting, fixing, sealing, protecting the chip, enhancing the electric heating performance and the like. The purpose of packaging of a microelectronic device is to carry out mechanical protection and electrical connections, to protect the precise device from mechanical and environmental image, and to remove heat generated by the chip. Another major role played by packaging is to ensure the transfer of energy and conversion of signals between the inside and outside of the device and between the components.

After an existing film bulk acoustic resonator is packaged, a cavity is usually only formed in an effective area of the film bulk acoustic resonator, so that an acoustic reflection structure is formed in cooperation with a packaging layer, but performance improvement of the film bulk acoustic resonator is limited.

SUMMARY

Aiming at the defects in the prior art, the disclosure provides a packaging structure and method of an acoustic device so as to improve the performance of the acoustic device after packaging.

In order to realize the purpose, the technical solutions adopted by embodiments of the disclosure are as follows.

According to an aspect of the embodiments of the disclosure, a packaging structure of an acoustic device is provided, which includes a substrate and a piezoelectric stack structure located on the substrate, wherein the piezoelectric stack structure comprises an effective area and a bonding pad area, a first organic material layer is disposed on the piezoelectric stack structure, the first organic material layer comprises a first supporting part with a window and a second supporting part located in the window, the effective area and the bonding pad area are exposed out of the window, the second supporting part is located between the effective area and the bonding pad area, a second organic material layer covering the window is disposed on the first organic material layer, so as to form a first cavity located in the effective area and the bonding pad area, the second supporting part forms a first acoustic reflection structure, and the first supporting part is matched with the second organic material layer to form a second acoustic reflection structure.

Optionally, an orthographic projection of the first supporting part on the piezoelectric stack structure and an orthographic projection of the second organic material layer on the piezoelectric stack structure have an overlapping area sand a non-overlapping area, a portion, located in the overlapping area, of the first supporting part is matched with the second organic material layer to form a first part of the second acoustic reflection structure, and a portion, located in the non-overlapping area, of the first supporting part forms a second part of the second acoustic reflection structure.

Optionally, a plurality of spaced grooves are disposed in the first supporting part, and the grooves and the first supporting part are matched with the second organic material layer to form a third acoustic reflection structure.

Optionally, a plurality of spaced grooves are disposed in the first supporting part, the grooves are filled with high-impedance material layers, and the high-impedance material layers and the first supporting part form a fourth acoustic reflection structure.

Optionally, a cross-sectional shape of the first acoustic reflection structure along a horizontal plane is a polygon enclosed by irregular straight lines or curves s.

Optionally, the first acoustic reflection structure is along a periphery of the effective area, and an edge of the first, acoustic reflection structure is parallel to an edge of the effective area.

Optionally, the second organic material layer is packaged, as a cap, over the effective area. Optionally, the piezoelectric stack structure comprises a bottom electrode, a piezoelectric layer and a top electrode which are sequentially disposed on the substrate, an overlapping area of the orthographic projections of the bottom electrode and the top electrode on the substrate is an effective area, a non-overlapping area of the orthographic projection of the bottom electrode on the substrate relative to the top electrode is a first bonding pad area, and a non-overlapping, area of the orthographic projection of the top electrode on the substrate relative to the bottom electrode is a second bonding pad area.

Optionally, a first bonding pad connected with the bottom electrode is disposed in the first bonding pad area, and a second bonding pad connected with the top electrode is disposed in the second bonding pad area.

Optionally, a metal line is disposed on the second organic material layer, the metal line comprises a first part and a second part connected to each other, the first part is electrically connected to electrodes of the piezoelectric stack structure, and the second part forms >a passive device.

Optionally, a second cavity is disposed on a side, close to the piezoelectric stack structure, of the substrate, and the second cavity directly corresponds to the effective area of the piezoelectric stack structure.

According to another aspect of embodiments of the disclosure, a packaging method of an acoustic device is provided, which includes: a substrate is provided; a piezoelectric stack structure is formed on the substrate, the piezoelectric stack structure includes an effective area and a bonding pad area; a first organic material layer is formed on the piezoelectric stack structure; the first organic material layer is patterned to form a first supporting part with a window and a second supporting part located in the window, the effective area and the bonding pad area, are exposed out of the window, and the second supporting part is located between the effective area and the bonding pad area; and a second organic material layer covering the window is formed on the first organic material layer, so as to form a first cavity in the effective area and the bonding pad area, the second supporting part forms a first acoustic reflection structure, and the first supporting part is matched with the second organic material layer to form a second acoustic reflection structure.

Optionally, the operation that the first organic material layer is formed on the piezoelectric stack structure includes: the first organic material layer is formed on the piezoelectric stack structure by using vacuum film pressing.

Optionally, the operation that the second organic material layer covering the window is formed on the first organic material layer includes: the second organic material layer covering the window is formed on the first organic material layer by using roller film pressing.

The beneficial effects of the disclosure are as follows.

The disclosure provides the packaging structure and method of the acoustic device, including: the substrate and the piezoelectric stack structure located on the substrate, the piezoelectric stack structure includes the effective area and the bonding pad area, the first organic material layer is disposed on the piezoelectric stack structure, the first organic material layer includes the first supporting part with the window and the second supporting part located in the window, the effective area and the bonding pad area are exposed out of the window, the second supporting part is located between the effective area and the bonding pad area, the second organic material layer covering the window is disposed on the first organic material layer, so that the first cavity located in the effective area and the bonding pad area is formed, the second supporting part is configured for forming the first acoustic reflection structure, when being transmitted to the first acoustic reflection structure, acoustic waves can be reflected back to the effective area, so that the loss of the acoustic waves is reduced, and the performance of the acoustic device is improved. In addition, the first supporting part is matched with the second organic material layer to form the second acoustic reflection structure, so that when part of acoustic waves are not reflected back by the first acoustic reflection structure and are transmitted to the second acoustic reflection structure, the acoustic waves can be reflected back to the effective area, so that the loss of the acoustic waves is further reduced, and the performance of the acoustic device is improved.

BRIEF DESCRIPTION OF THE DRAWINGS

In order to describe the technical solutions in the embodiments of the disclosure more clearly, the drawings required to be used in descriptions about the embodiments will be simply introduced below, it is to be understood that the drawings described below are only some embodiments of the disclosure and are therefore not to be considered limiting of scope, and other drawings may further be obtained by those of ordinary skill in the art according to these drawings without creative work.

Figure 1:
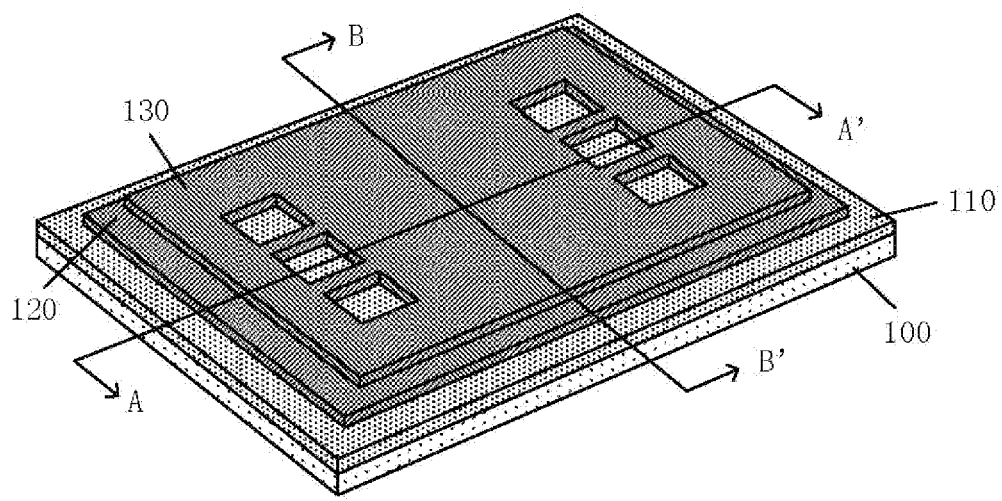
FIG. 1 is a schematic structure diagram of a packaging structure of an acoustic device provided by an embodiment of the disclosure.

In the figures, 100. Substrate; 101. Second cavity; 110. Piezoelectric layer; 120. First organic material layer; 121. Groove; 122. Second supporting part; 123. First supporting part; 130. Second organic material layer; 140. Bottom electrode; 141. First bonding pad; 150. Top electrode; 151. Second bonding pad; 160. Piezoelectric stack structure; 171. First cavity; 180. First acoustic reflection structure; 190. Second acoustic reflection structure; 191. First part of second acoustic reflection structure; 192. Second part of second acoustic reflection structure; 220. Third acoustic reflection structure; 231. First part; 232. Second part; 240. Dielectric layer; and 250. Transition layer.

DETAILED DESCRIPTION OF THE EMBODIMENTS

In order to make the purpose, the technical solutions and the advantages of the embodiments of the disclosure clearer, the technical solutions in the embodiments of the disclosure will be clearly and completely described below in combination with the drawings in the embodiments of the disclosure, and it is apparent that the described embodiments are only a part rather all of embodiments of the disclosure. The components of the embodiments of the disclosure, as generally described and illustrated in the drawings herein, could be arranged and designed in a wide variety of different configurations.

It is to be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It is to be understood that when an element (such as a layer, area, or substrate) is described as "being on another element" or "extending to another element", the element may be directly on another element or directly extend to another element, or an intervening element may also be present. Instead, when an element is described as "being directly on another element" or "directly extending to another element", no medium element is present. Similarly, it is to be understood that when an element (such as a layer, area, or substrate) is described as "being on another element" or "extending to another element", the element may be directly on another element or directly extend to another, element, or an intervening element may also be present. Instead, when an element is described as being "directly on another element" or "directly extending to another element", no medium element is present. It is also to be understood that when an element is described as being "connected to" or "coupled to" another element, the element may be directly connected to or coupled to another element, or an intervening element may also be present. Instead, when an element is referred to as being "directly connected to" or "directly coupled to" another element, no medium element is present.

Unless defined otherwise, all terms (including technical and scientific terms) used herein have the same meaning as commonly understood by is those of ordinary skill in the art to which this disclosure belongs. It is also to be understood that the terms used herein should be interpreted as having a meaning that is consistent with their meaning in the context of this specification and the relevant art and should not be interpreted in an idealized or overly formal sense unless expressly so defined herein.

Figure 2:
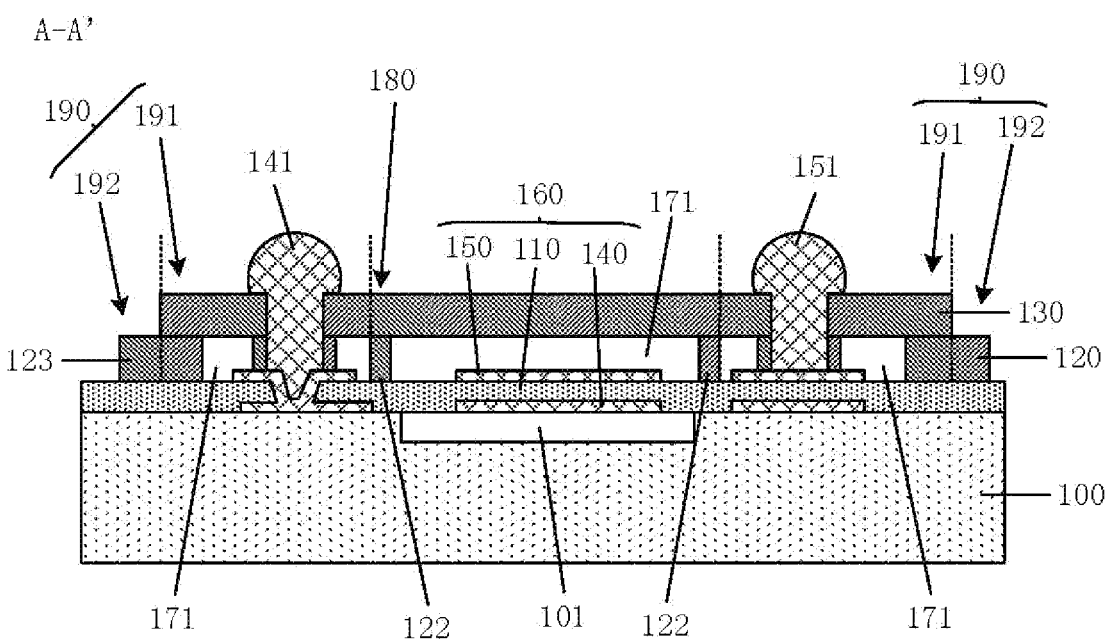
FIG. 2 is a schematic diagram of a cross-sectional view along the A-A section in FIG. 1 according to an embodiment of the disclosure.

According to an aspect of the embodiments of the disclosure, a packaging structure of an acoustic device is, provided, as shown in FIG. 1 and FIG. 2, including a substrate 100 and a piezoelectric stack structure 160 located on the substrate 100, wherein the piezoelectric stack structure 160 includes an effective area and a bonding pad area, a first organic material layer 120 is disposed on the piezoelectric stack structure 160, the first organic material layer 120 includes a first supporting part 123 with a window and a second supporting part 122 located in the window after being patterned, the upper surface, located in the effective area and the bonding pad area, of the piezoelectric stack structure is exposed out of the window, the second supporting part 122 is located between the effective area and the bonding pad area, a second organic material layer 130 covering the window is disposed on the first organic material layer 120, so that the space in the window is closed to form a first cavity 171, the effective area and the bonding pad area are located in the first cavity 171, and the second supporting part 122 supports the second organic material layer 130 as <a supporting pillar in the first cavity.

With further reference to FIG. 2, the second organic material layer 130 covers the window in a capping (cavity top) manner, so that the first cavity 171 in the window is formed, the second supporting part 122 is located between the effective area and the bonding pad area, therefore, the second supporting part 122 can form a first acoustic reflection structure 180, when being transmitted to the first acoustic reflection structure 180, acoustic waves can be reflected back to the effective area, so that the loss of the acoustic waves is reduced, and the performance of the acoustic device is improved.

With further reference to FIG. 2, the first supporting part 123 is matched with the second organic material layer 130 to form the second acoustic reflection structure 190, so that when part of acoustic waves are not reflected back by the first acoustic reflection structure 180 and are transmitted to the second acoustic reflection structure 190, the acoustic waves can be reflected back to the effective area, so that the loss of the acoustic waves is further reduced, and the performance of the acoustic device is improved.

In addition, the packaging layer in the disclosure is formed by the first organic material layer 120 and the second organic material layer 130, so that during packaging, the first organic material layer 120 can serve as a supporting structure to support the second organic material layer 130 to cover the window in a patterning manner, meanwhile, the first cavity 171 is directly formed, and the problem that the piezoelectric stack structure 160 in the cavity is polluted by residues left in the cavity when a sacrificial layer is filled and then released (film packaging) is avoided. Meanwhile, the thickness of packaging in the disclosure is moderate and larger than that of film packaging, so that the pressure of a subsequently packaged epoxy resin layer on the device can be borne.

In some embodiments, as shown in FIG. 2, a bonding pad connected to the piezoelectric stack structure 160 may be disposed in the bonding pad area of the piezoelectric stack structure 160, the bonding pad may be formed by forming a bonding pad through hole in the second organic material layer 130 in a patterning manner, the bonding pad through hole communicates with the first cavity 171 and is located above the bonding pad area, in such a case, the bonding pad electrically connected to the piezoelectric stack structure 160 can be formed directly by a metal ball bonding or copper metal interconnection process, the following problems caused by adopting Through Silicon Via (TSV) packaging technology, namely, forming micropores by deep silicon etching, and filling the deep holes with conductive substances to realize vertical electrical interconnection of the through SVs are avoided: on one hand, in the method, because the substrate needs to be thinned, cracks are easy to form, and on the other hand, with the method, the packaging thickness is large and the process is complicated.

Optionally, a metal line may further be disposed on the second organic material layer 130, the metal line includes a first part 231 and a second part 232 connected to each other, the first part 231 is connected to the upper and lower electrodes of the piezoelectric stack structure, so that the upper and lower electrodes of the resonator are led out through the metal line; the second part 232 can be configured to form a passive device, for example, a capacitor, an inductor and the like, so that the passive device can be integrated in the packaging structure of the acoustic device of the disclosure, and the complexity of externally connecting a capacitor and an inductor is saved.

Figure 8:
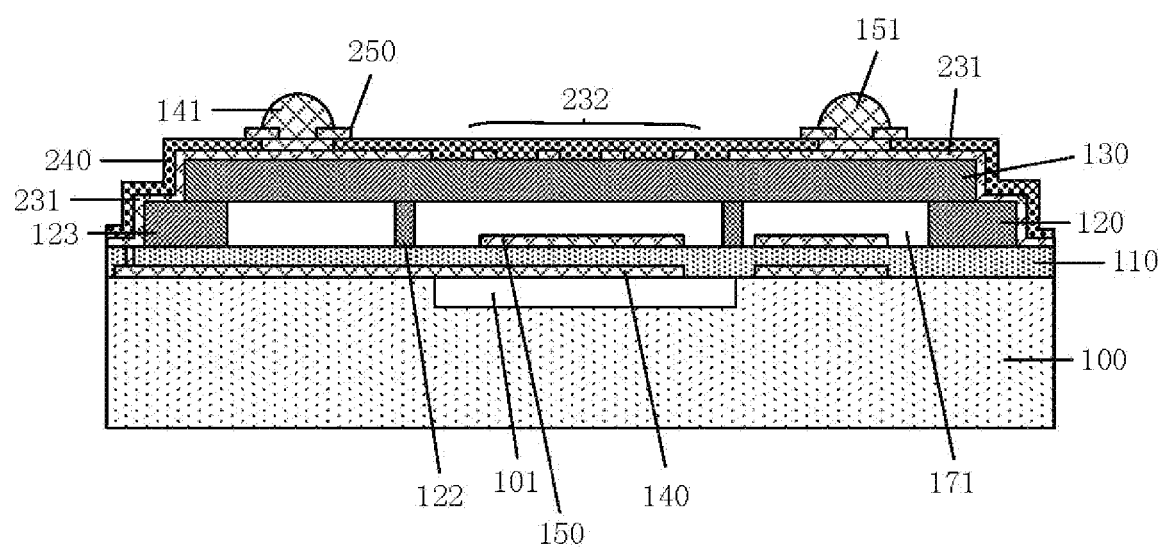
FIG. 8 is a schematic diagram of a cross-sectional view along the A-A section in FIG. 1 in another embodiment of the disclosure.

As shown in FIG. 8, after the first organic material layer 120 and the second organic material layer 130 are formed, an interconnection structure can be formed in the area, not covered by the first organic material layer 120 and the second organic material layer 130, of the piezoelectric stack structure 160, then a metal line is formed on the outer surfaces of the first organic material layer 120 and the second organic material layer 130, the metal line may include two insulatively isolated first parts 231, one of which may lead out the bottom electrode 140 below the piezoelectric layer 110 through the interconnection structure, and the other may directly lead out the top electrode 150 above the piezoelectric layer 110. The second part 232 of the metal line then forms a passive device on the upper surface of the second organic material layer 130.

As shown in FIG. 8, to facilitate subsequent integration of the acoustic package structure, a full dielectric layer 240 may also be deposited after the metal wire is disposed for insulation isolation, then a hole is formed through etching, and a bonding pad is formed in the hole in a matching manner. For example, when the metal line includes two insulatively isolated first parts 231, and the two first parts 231 are configured for, when the bottom electrode 140 and the top electrode 150 are led out, a first bonding pad 141 may be disposed at the first part 231 leading out the bottom electrode 140, and a second bonding pad 151 may be disposed at the first part 231 leading out the top electrode 150, respectively. In addition, in order to facilitate the arrangement of the bonding pads, a transition layer 250 may be disposed first, and then the bonding pads may be formed on the transition layer 250.

Figure 3:
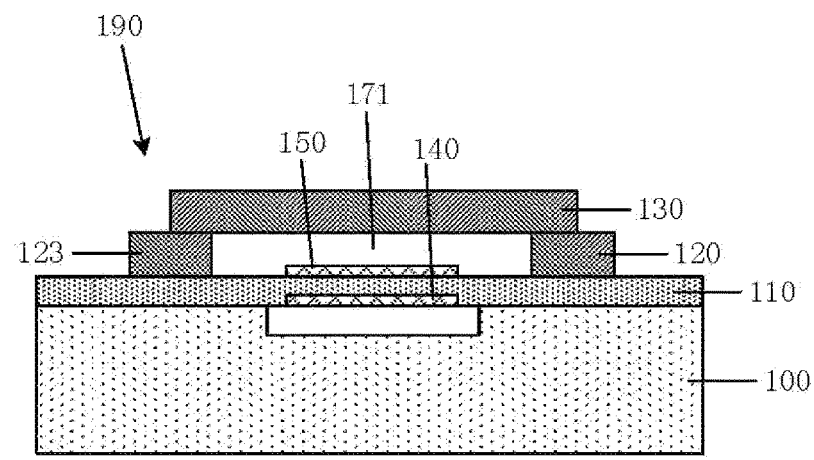
FIG. 3 is a schematic diagram of a cross-sectional view along the B-B section in FIG. 1.

Optionally, as shown in FIGS. 1 to 3, the first supporting part 123 partially protrudes out of the second organic material layer 130, so that a step is formed on the side, facing away from the first cavity 171, of the joint of the first supporting part 123 and the second organic material layer 130, then the orthographic projection of each of the second organic material layer 130 and the first supporting part 123 on the piezoelectric stack structure 160 has an overlapping area and a non-overlapping area, thus the portion, located in the overlapping area, of the first supporting part 123 may be matched with the second organic material layer 130 to form a first part 191 of the second acoustic reflection structure, and the portion, located in the non-overlapping area, of the first supporting part 123 is configured for forming a second part 192 of the second acoustic reflection structure, so that the number of the acoustic reflection structures is further increased, and the performance of the device is improved.

Figure 4:
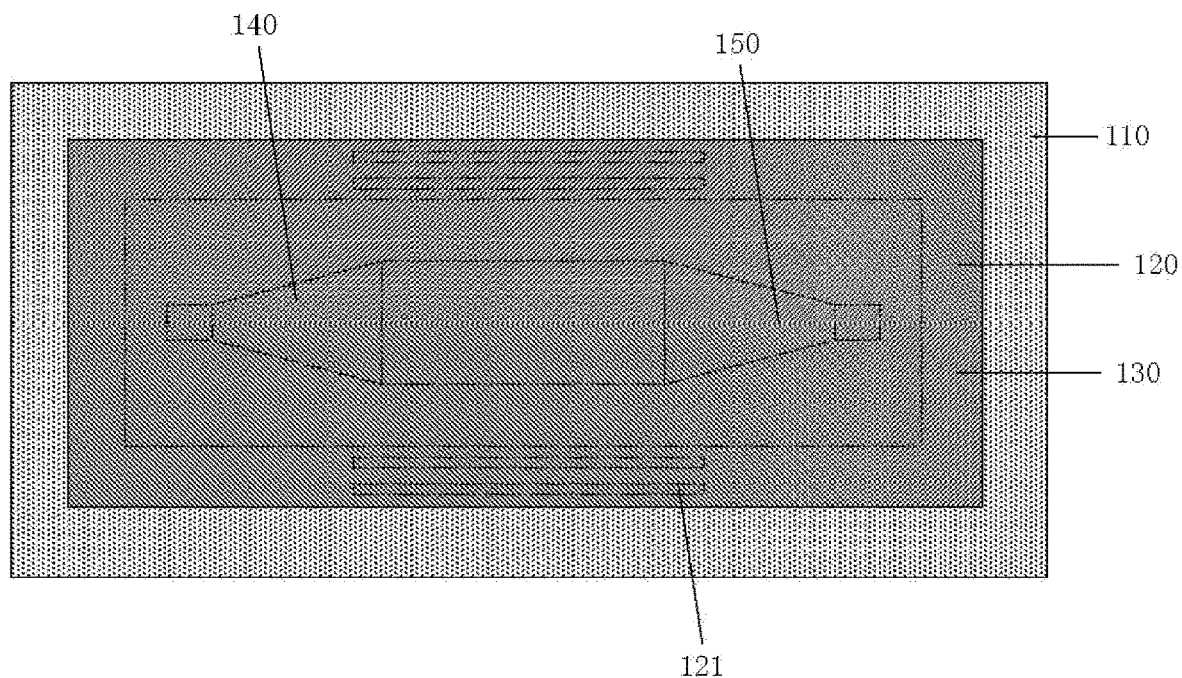
FIG. 4 is a schematic diagram I of a top view of a packaging structure of an acoustic device provided by an embodiment of the disclosure.
Figure 5:
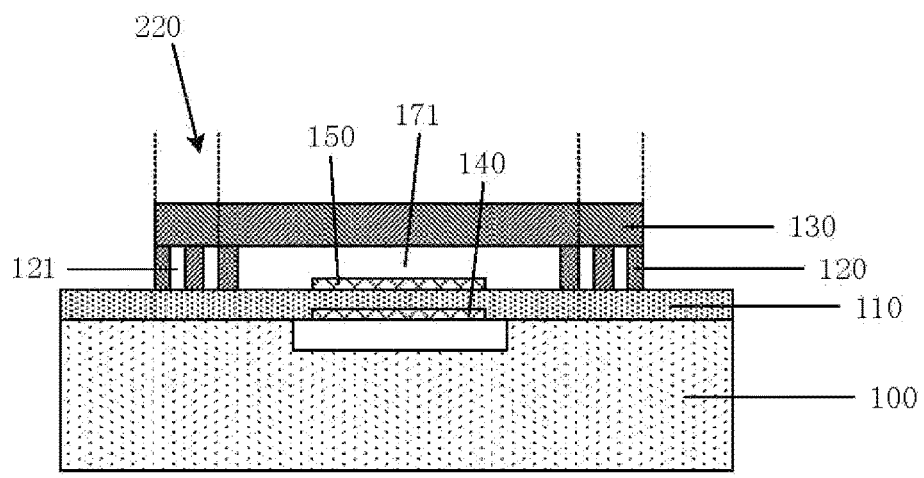
FIG. 5 is a schematic diagram I of a cross-sectional view of a packaging, structure of an acoustic device provided by an embodiment of the disclosure.

Optionally, as shown in FIG. 4 and FIG. 5, a plurality of spaced grooves 121 may further be disposed in the first supporting part 123, in other words, the grooves 121 and solid portions of the first supporting part 123 form an ABAB arrangement on the surface of the piezoelectric stack structure 160, the second organic material layer 130 covers the grooves 121, so that each groove 121 can be enclosed by the solid portion of the first supporting part 123, the piezoelectric stack structure 160 and the second organic material layer 130 to form a closed cavity, therefore, a third acoustic reflection structure 220 can be formed by the grooves 121 and the solid portion of the first support part 123, namely, the third acoustic reflection structure 220 reflects acoustic waves by using a high and low acoustic impedance principle, and thus, the performance of the device is further improved.

In some embodiments, when the third acoustic reflection structure 220 is disposed, correspondingly, the first supporting part 123 may, as shown in FIG. 4 and FIG. 5, do not protrude out of the second organic material layer 130, namely, in the implementation mode, the second part 192 of the second acoustic reflection structure is not disposed.

In some embodiments, when the third acoustic reflection structure 220 is disposed, correspondingly, the first supporting part 123 may be disposed in a manner of protruding out of the second organic material layer 130 as shown in FIG. 1 and FIG. 2, in the embodiment, the groove 121 is partially located in the overlapping area of the first supporting part 123 and the second organic material layer 130, namely, in the implementation mode, both the second part 192 of the second acoustic reflection structure and the third acoustic reflection structure 220 are disposed.

Optionally, referring to FIG. 4 and FIG. 5, a plurality of spaced grooves 121 are disposed in the first supporting part 123, the second organic material layer 130 covers the grooves 121, the grooves 121 may be filled with a high impedance material layer, such as metal or piezoelectric material, so that the high impedance material layer and the first supporting part 123 can form an ABAB arrangement on the surface of the piezoelectric stack structure 160, the high impedance material layer and the first supporting part 123 form a fourth acoustic reflection structure, namely, the fourth acoustic reflection structure also reflects acoustic waves using the high and low acoustic impedance principle.

The a cross-sectional shape of the first acoustic reflection structure 180 along the horizontal plane is a polygon enclosed by irregular straight lines or curves.

The first acoustic reflection structure 180 is along the periphery of the effective area, and the edge of the'first acoustic reflection structure 180 is parallel to the edge of the effective area.

The second organic material layer 130 is packaged, as a cap, over the effective area.

It is to be understood that the embodiment provided with the fourth acoustic reflection structure may refer to the above combination of the third acoustic reflection structure 220 and the second part 192 of the second acoustic reflection structure to form the implementation mode of coexistence or non-coexistence of the fourth acoustic reflection structure and the second part 192 of the second acoustic reflection structure, which will not be repeated here.

Optionally, as shown in FIGS. 1 to 3, the piezoelectric stack structure 160 includes a bottom electrode 140, a piezoelectric layer 110 and a top electrode 150 which are sequentially disposed on the substrate 100, the overlapping area of the orthographic projections of the bottom electrode 140 and the top electrode 150 on the substrate is an effective area, the non-overlapping area of the orthographic projection of the bottom electrode 140 on the substrate 100 relative to the top electrode 150 is a first bonding pad 141 area, the non-overlapping area of the orthographic projection of the top electrode 150 on the substrate 100 relative to the bottom electrode is a second bonding pad 151 area, and the first bonding pad 141 area and the second bonding pad 151 area collectively form the bonding pad area in the foregoing implementation mode. Optionally, a first bonding pad 141 connected with the bottom electrode 140 is disposed in the first bonding pad 141 area, a second bonding pad 151 connected with the top electrode 150 is disposed in the second bonding pad area 151, and the first bonding pad 141 and the second bonding pad 151 together lead the bottom electrode 140 and the top, electrode 150 out of the packaging layer, thereby facilitating wiring.

In some embodiments, as shown in FIG. 4, the acoustic device of the disclosure may be a resonator, in which case, as shown in FIG. 2, the piezoelectric stack structure 160 includes one effective area and two bonding pad areas, and the first supporting part 123 is annular and surrounds the periphery of the one effective area and two bonding pad areas.

Figure 6:
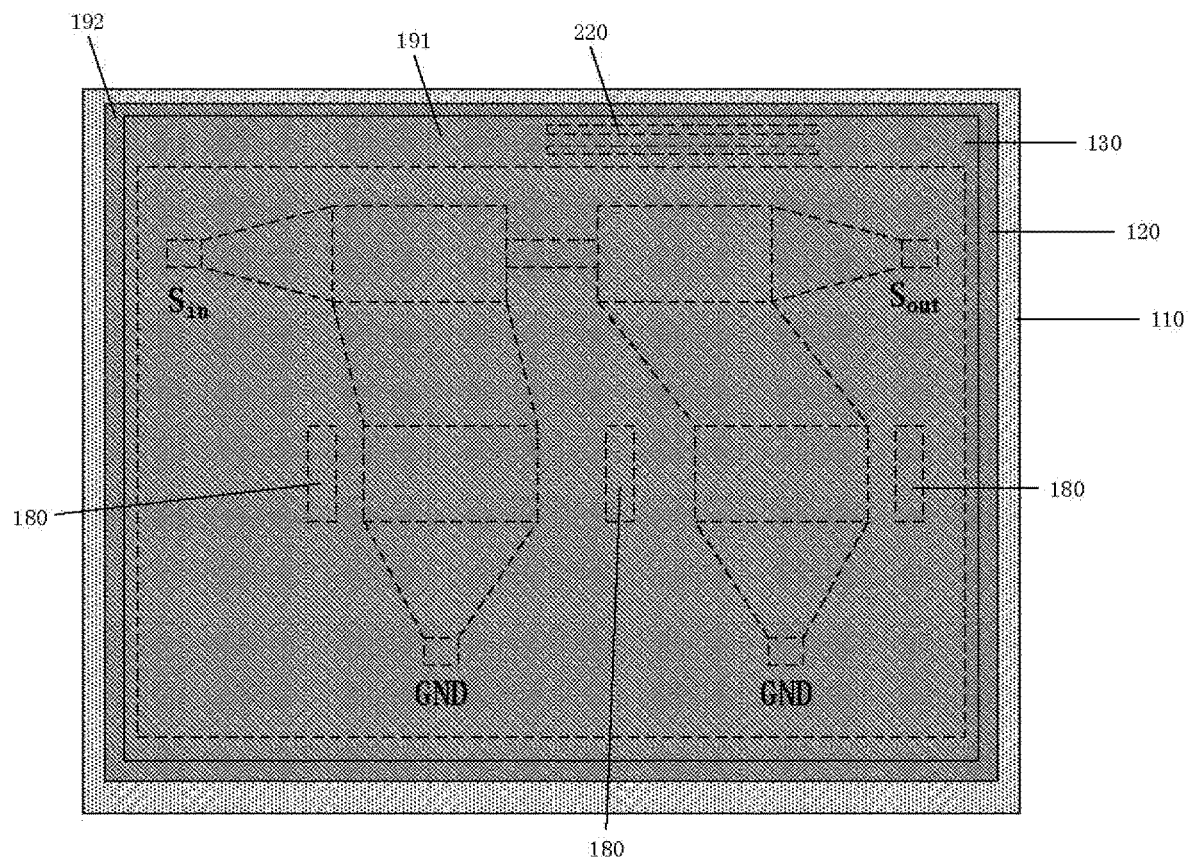
FIG. 6 is a schematic diagram II of a top view of a packaging structure of an acoustic device provided by an embodiment of the disclosure.

In some embodiments, as shown in FIG. 6, the acoustic device of the disclosure may also be a filter, the filter includes a plurality of resonators connected in series and/or in parallel, namely, the piezoelectric stack structure 160 includes a plurality of effective areas and a plurality of bonding pad areas, the top electrode 150 and the top electrode 150 of two adjacent effective areas are connected or the bottom electrode 140 and the bottom electrode 140 of two adjacent effective areas are connected, thereby forming the plurality of resonators connected in series and/or in parallel. The first supporting part 123 is annular and surrounds the periphery of the plurality of effective areas, and the plurality of bonding pad areas.

Figure 7:
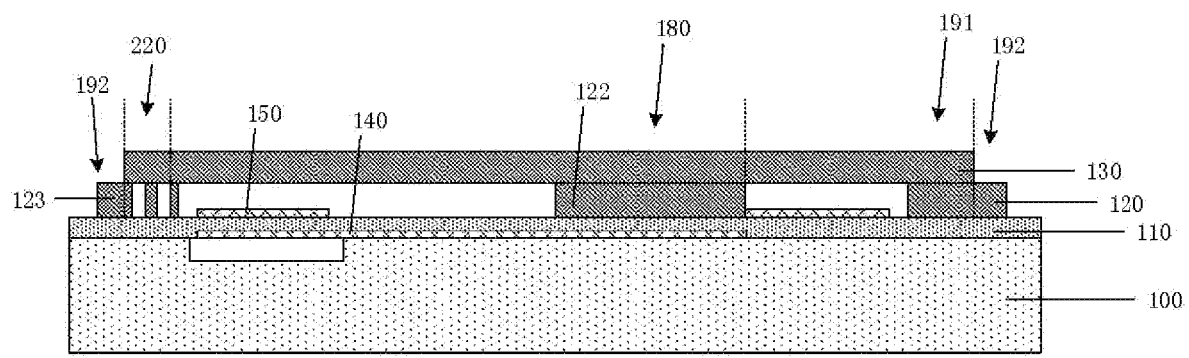
FIG. 7 is a schematic diagram II of a cross-sectional view of a packaging structure of an acoustic device provided by an embodiment of the disclosure.

As shown in FIG. 6 and FIG. 7, when the acoustic device is a filter, the first acoustic reflection structure 180, the first part 191 of the second acoustic reflection structure, the second part 192 of the second acoustic reflection structure, and the third acoustic reflection structure 220 may be included, or, when the acoustic device is a filter, the first acoustic reflection structure 220, the first part 191 of the second acoustic reflection structure, the second portion 192 of the second acoustic reflection structure, and the fourth acoustic reflection structure may be included.

Optionally, as shown in FIG. 2, FIG. 3, FIG. 5 and FIG. 7, a second cavity is disposed on the side, close to the piezoelectric stack structure 160, of the substrate 100, and the second cavity 101 vertically corresponds to the effective area of the piezoelectric stack structure 160, so that the performance of the device can be improved.

According to another aspect of embodiments of the disclosure, a packaging method of an acoustic device is provided, which includes: a substrate 100 is provided; a piezoelectric stack structure 160 is formed on the substrate 100, and the piezoelectric stack structure 160 includes an effective area and a bonding pad area; a first organic material layer 120 is formed on the piezoelectric stack structure 160; the first organic material layer 120 is patterned to form a first supporting part 123 with a window and a second supporting part 122 located in the window, the effective area and the bonding pad area are exposed out of the window, the second supporting part 122 is located between the effective area and the bonding pad area; a second organic material layer 130 covering the window is formed on the first organic material layer 120, so that a first cavity 171 is formed in the effective area and the bonding pad area, the second supporting part 122 is configured for forming a first acoustic reflection structure 180, and the first supporting part 123 is matched with the second organic material layer 130 to form a second acoustic reflection structure 190.

When the first organic material layer 120 is patterned to form the first supporting part 123 and the second supporting part 122, the whole first organic material layer 120 can be illuminated and developed through a first mask plate to form patterns, and the second supporting part 122 and the first supporting part 123 are formed after baking and hardening.

Similarly, after the whole organic material layer is formed on the second supporting part 122 and the first supporting part 123, a cavity top can be formed through illumination and development of a second mask plate, and the second organic material layer 130 is formed after baking. As shown in FIG. 2, when an electrode of the piezoelectric stack structure 160 in the bonding pad area needs to be led out through a bonding pad, only a bonding pad through hole needs to be formed at a position above the bonding pad area correspondingly when the whole organic material layer is patterned, and then a corresponding bonding pad is formed through a metal ball bonding or metal interconnection process. As shown in FIG. 8, the electrodes of the piezoelectric stack structure 160 may also be led out directly by way of metal lines.

Optionally, the operation that the first organic material layer 120 is formed on the piezoelectric stack structure 160 includes: the first organic material layer 120 is formed on the piezoelectric stack structure 160 by using vacuum film pressing. The operation that the second organic material layer 130 covering the window is formed on the first organic material layer 120 includes: the second organic material layer 130 covering the window is formed on the first organic material layer 120 by using roller film pressing.

The first acoustic reflection structures 180 (an irregular cylinder) serves as first order acoustic reflection, directly reflecting the lateral acoustic waves, of the resonator (the principle is acoustic impedance mismatch), thus reducing energy losses. The structural edge tightly attaches to the outer edge of the film bulk acoustic resonator to form a surrounding shape. When part of the acoustic waves are reflected by the first acoustic reflection structure 180 and do not return to the effective area of the film bulk acoustic resonator, the part of the acoustic waves propagate to the second acoustic reflection structure 190. In such a case, the second acoustic reflection structure 190 further reflects acoustic waves leaked by the first acoustic reflection structure 180 back to the effective area of the film bulk acoustic resonator.

In addition, the first organic material layer 120 forms the first acoustic reflection structure 180 which is located inside the film bulk acoustic resonator filter, and the second organic material layer 130 is packaged, as a cap, over the working area of the film bulk acoustic filter. The first acoustic reflection structure 180 serves as a support structure, on one hand, the second organic material layer 130 can be prevented from collapsing, and thus the packaging stability of the device is improved; and on the other hand, it serves as the acoustic reflection structure, so that the performance of the film bulk acoustic resonator is improved.

In conclusion, compared with a TSV packaging technology, a thinning process is not needed, and therefore, the situation of wafer cracks cannot occur. Meanwhile, the thickness of packaging of the disclosure is moderate and is smaller than that of TSV packaging, thus subsequent module packaging is facilitated, meanwhile, the process is simple, and the cost is lower. Compared with a film packaging technology, the packaging cavity does not need to be released, so that the situation that chemical liquid and residues are left in the cavity and the surface of the device is avoided, and the performance of the device is not affected. Meanwhile, the thickness of packaging in the disclosure is moderate and larger than that of film packaging, so that the pressure of a subsequently packaged epoxy resin layer on the device can be borne.

The foregoing is merely preferred embodiments of the disclosure and is not intended to limit the disclosure, and various modifications and variations of the disclosure may be available for those skilled in the art. Any modifications, equivalents, improvements, etc., made within the spirit and principles of the disclosure are intended to be included within the scope of the disclosure.

The invention claimed is:

1. A packaging structure of an acoustic device, comprising a substrate and a piezoelectric stack structure located on the substrate, wherein the piezoelectric stack structure comprises an effective area and a bonding pad area, a first organic material layer is disposed on the piezoelectric stack structure, the first organic material layer comprises a first supporting part with a window and a second supporting part located in the window, the effective area and the bonding pad area are exposed out of the window, the second supporting part is located between the effective area and the bonding pad area, a second organic material layer covering the window is disposed on the first organic material layer, so as to form a first cavity located in the effective area and the bonding pad area, the second supporting part forms a first acoustic reflection structure, and the first supporting part is matched with the second organic material layer to form a second acoustic reflection structure.

2. The packaging structure of the acoustic device according to claim 1, wherein an orthographic projection of the first supporting part on the piezoelectric stack structure and an orthographic projection of the second organic material layer on the piezoelectric stack structure have an overlapping area and a non-overlapping area, a portion, located in the overlapping area, of the first supporting part is matched with the second organic material layer to form a first part of the second acoustic reflection structure, and a portion, located in the non-overlapping area, of the first supporting part forms a second part of the second acoustic reflection structure.

3. The packaging structure of the acoustic device according to claim 1, wherein a plurality of spaced grooves are disposed in the first supporting part, and the grooves and the first supporting part form a third acoustic reflection structure.

4. The packaging structure of the acoustic device according to claim 1, wherein a plurality of spaced grooves are disposed in the first supporting part, the grooves are filled with high impedance material layers, and the high impedance material layers and the first supporting part form a fourth acoustic reflection structure.

5. The packaging structure of the acoustic device according to claim 1, wherein a cross-sectional shape of the first acoustic reflection structure along a horizontal plane is a polygon enclosed by irregular straight lines or curves.

6. The packaging structure of the acoustic device according to claim 1, wherein the first acoustic reflection structure is along a periphery of the effective area, and an edge of the first acoustic reflection structure is parallel to an edge of the effective area.

7. The packaging structure of the acoustic device according to claim 1, wherein the second organic material layer is packaged, as a cap, over the effective area.

8. The packaging structure of the acoustic device according to claim 1, wherein the piezoelectric stack structure comprises a bottom electrode, a piezoelectric layer and a top electrode which are sequentially disposed on the substrate, an overlapping area of the orthographic projections of the bottom electrode and the top electrode on the substrate is an effective area, a non-overlapping area of the orthographic projection of the bottom electrode on the substrate relative to the top electrode is a first bonding pad area, and a non-overlapping area of the orthographic projection of the top electrode on the substrate relative to the bottom electrode is a second bonding pad area.

9. The packaging structure of the acoustic device according to claim 2, wherein the piezoelectric stack structure comprises a bottom electrode, a piezoelectric layer and a top electrode which are sequentially disposed on the substrate, an overlapping area of orthographic projections of the bottom electrode and the top electrode on the substrate is an effective area, a non-overlapping area of the orthographic projection of the bottom electrode on the substrate relative to the top electrode is a first bonding pad area, and a non-overlapping area of the orthographic projection of the top electrode on the substrate relative to the bottom electrode is a second bonding pad area.

10. The packaging structure of the acoustic device according to claim 3, wherein the piezoelectric stack structure comprises a bottom electrode, a piezoelectric layer and a top electrode which are sequentially disposed on the substrate, an overlapping area of the orthographic projections of the bottom electrode and the top electrode on the substrate is an effective area, a non-overlapping area of the orthographic projection of the bottom electrode on the substrate relative to the top electrode is a first bonding pad area, and a non-overlapping area of the orthographic projection of the top electrode on the substrate relative to the bottom electrode is a second bonding pad area.

11. The packaging structure of the acoustic device according to claim 4, wherein the piezoelectric stack structure comprises a bottom electrode, a piezoelectric layer and a top electrode which are sequentially disposed on the substrate, an overlapping area of the orthographic projections of the bottom electrode and the top electrode on the substrate is an effective area, a non-overlapping area of the orthographic projection of the bottom electrode on the substrate relative to the top electrode is a first bonding pad area, and a non-overlapping area of the orthographic projection of the top electrode on the substrate relative to the bottom electrode is a second bonding pad area.

12. The packaging structure of the acoustic device according to claim 8, wherein a first bonding pad connected with the bottom electrode is disposed in the first bonding pad area, and a second bonding pad connected with the top electrode is disposed in the second bonding pad area.

13. The packaging structure of the acoustic device according to claim 1, wherein a metal line is disposed on the second organic material layer, the metal line comprises a first part and a second part connected to each other, the first part is electrically connected to electrodes of the piezoelectric stack structure, and the second part forms a passive device.

14. The packaging structure of the acoustic device according to claim 1, wherein a second cavity is disposed on a side, close to the piezoelectric stack structure, of the substrate, and the second cavity directly corresponds to the effective area of the piezoelectric stack structure.

15. The packaging structure of the acoustic device according to claim 2, wherein a second cavity is disposed on a side, close to the piezoelectric stack structure, of the substrate, and the second cavity directly corresponds to the effective area of the piezoelectric stack structure.

16. The packaging structure of the acoustic device according to claim 3, wherein a second cavity is disposed on a side, close to the piezoelectric stack structure, of the substrate, and the second cavity directly corresponds to the effective area of the piezoelectric stack structure.

17. The packaging structure of the acoustic device according to claim 4, wherein a second cavity is disposed on a side, close to the piezoelectric stack structure, of the substrate, and the second cavity directly corresponds to the effective area of the piezoelectric stack structure.

18. A packaging method of an acoustic device, comprising:
providing a substrate;
forming a piezoelectric stack structure on the substrate, the piezoelectric stack structure comprising an effective area and a bonding pad area;
forming a first organic material layer on the piezoelectric stack structure;
patterning the first organic material layer to form a first supporting part with a window and a second supporting part located in the window, wherein the effective area and the bonding pad area are exposed out of the window, and the second supporting part is located between the effective area and the bonding pad area;
forming a second organic material layer covering the window on the first organic material layer, so as to form a first cavity in the effective area and the bonding pad area, wherein the second supporting part forms a first acoustic reflection structure, and the first supporting part is matched with the second organic material layer to form a second acoustic reflection structure.

19. The packaging method of the acoustic device according to claim 18, wherein forming the first organic material layer on the piezoelectric stack structure comprises: forming the first organic material layer on the piezoelectric stack structure by using vacuum film pressing.

20. The packaging structure of the acoustic device according to claim 18, wherein forming the second organic material layer covering the window on the first organic material layer comprises: forming the second organic material layer covering the window on the first organic material layer by using roller film pressing.

* * * * *